US008204254B2

(12) United States Patent
Shannon

(10) Patent No.: US 8,204,254 B2
(45) Date of Patent: Jun. 19, 2012

(54) VACUUM TUBE PREAMPLIFIER, AMPLIFIER AND METHOD FOR MUSICAL INSTRUMENTS WITH PROGRAMMABLE CONTROLS

(76) Inventor: Donelson Arthur Shannon, Austin, TX (US)

( * ) Notice: Subject to any disclaimer, the term of this patent is extended or adjusted under 35 U.S.C. 154(b) by 919 days.

(21) Appl. No.: 12/221,499

(22) Filed: Aug. 4, 2008

(65) Prior Publication Data

US 2009/0074205 A1 Mar. 19, 2009

Related U.S. Application Data

(60) Provisional application No. 60/967,008, filed on Aug. 31, 2007.

(51) Int. Cl.
*H03G 9/00* (2006.01)

(52) U.S. Cl. ......................... 381/102; 381/118; 381/120

(58) Field of Classification Search .................... 381/61, 381/102, 118, 120; 330/49
See application file for complete search history.

(56) References Cited

U.S. PATENT DOCUMENTS

| | | | | | |
|---|---|---|---|---|---|
| 4,495,640 | A | * | 1/1985 | Frey | 381/61 |
| 5,012,199 | A | * | 4/1991 | McKale | 330/51 |
| 5,023,915 | A | * | 6/1991 | Brown, Sr. et al. | 381/120 |
| 5,133,014 | A | * | 7/1992 | Pritchard | 381/61 |
| 5,208,548 | A | * | 5/1993 | Van Riezen | 330/59 |
| 5,727,069 | A | * | 3/1998 | Hughes et al. | 381/61 |
| 5,789,689 | A | * | 8/1998 | Doidic et al. | 84/603 |
| 5,866,834 | A | * | 2/1999 | Burke et al. | 84/622 |
| 7,145,392 | B2 | * | 12/2006 | Peavey et al. | 330/262 |
| 2008/0144861 | A1 | * | 6/2008 | Melanson et al. | 381/120 |

* cited by examiner

*Primary Examiner* — Kimberly Nguyen
*Assistant Examiner* — Duy Nguyen
(74) *Attorney, Agent, or Firm* — Howison & Arnott, L.L.P.

(57) ABSTRACT

An amplifier is provided using digital potentiometer integrated circuits to control the tone of a vacuum tube preamplifier allowing digital control of the analog signal path of the amplifier. Using digital potentiometer integrated circuits to control the tone of a vacuum tube preamplifier results in an amplifier that preserves the unique tone quality of a vacuum tube amplifier that offers the flexibility, versatility, and user-friendly features of a digitally controlled amplifier, such as the ability to save and recall amplifier settings. The amplifier of the present invention is especially applicable for use with musical instruments such as for example, electric guitars.

3 Claims, 9 Drawing Sheets

VACUUM TUBE PREAMPLIFIER, AMPLIFIER AND METHOD FOR MUSICAL INSTRUMENTS WITH PROGRAMMABLE CONTROLS

CROSS REFERENCE TO RELATED APPLICATION

This application claims benefit of U.S. Provisional Application Ser. No. 60/967,008, filed on Aug. 31, 2007, and entitled VACUUM TUBE PREAMPLIFIER FOR MUSICAL INSTRUMENTS WITH DIGITALLY CONTROLLED DISTORTION.

FIELD OF THE INVENTION

The present invention relates generally to vacuum tube amplifiers. Particularly, the present invention relates to vacuum tube amplifiers for musical instruments. More particularly, the present invention relates to vacuum tube amplifiers for the electric guitar.

BACKGROUND

It is well known in the musical industry that the best sounding amplifiers use vacuum tubes to generate their unique tone. Particularly, the vast majority of guitarists agree that the best sounding guitar amplifiers use vacuum tubes to generate their unique tone. Unfortunately, a conventional vacuum tube amplifier is very limited in the amount of user-friendly features it can offer. User-friendly features are difficult to incorporate into a conventional vacuum tube amplifier because the controls are typically analog potentiometers. The amplifier is limited to creating the sound at which the potentiometers are currently set. In order to change the sound of the amplifier, one must manually turn the knobs, losing the previous setting of the amplifier. While playing live, it is impractical to adjust the amplifier tone controls in the middle of playing a song because this task is tedious and time consuming. Not being able to adjust the amplifier tone controls in the middle of playing a song is a major problem for guitarists because they often prefer to use a wide variety of amplifier sounds while performing. Guitarists have also had a long-felt need to be able to save amplifier settings when recording in a studio in order to easily recall amplifier settings that are desired for a particular track. What the guitar player would most like is an amplifier with self-explanatory controls, capable of producing the entire palette of traditional and modern amplifier guitar sounds with perfect authenticity, whose settings could also be easily stored in a digital memory and recalled instantly via a foot-operated controller. See, U.S. Pat. No. 5,208,548, filed 1992, Background Section, assigned by Randall Smith to Mesa Engineering. A guitar amplifier that has self-explanatory controls, is capable of producing the entire palette of traditional and modern amplifier guitar sounds both vacuum tube and digital sounds with perfect authenticity, whose settings could also be easily stored in a digital memory and recalled instantly via an easily operated controller would eliminate many of the limitations of conventional tube amplifiers.

A number of amp makers have started using Digital Signal Processors, DSP, to emulate the sound of vacuum tube amplifiers in order to allow digital control of the amplifier, thus increasing the flexibility and versatility of the amplifier. The major weakness of the DSP-based amplifiers is that they do not sound as good as the vacuum tube amplifiers they attempt to emulate. If a vacuum tube amplifier could be digitally controlled without compromising the tone of the amplifier, then the user-friendly features that are available with digitally controlled amplifiers could be implemented in a vacuum tube amplifier that produces the optimal tone demanded by musicians, and particularly guitarists.

Amplifier companies have sold guitar preamps that attempt to provide a guitar amplifier that has self-explanatory controls, capable of producing the entire palette of traditional and modern amplifier guitar sounds both vacuum tube and digital sounds with perfect authenticity, and whose settings can be easily stored in a digital memory and recalled instantly via an easily operated controller. For example, Mesa Boogie adopted the model name "Triaxis" for such a preamp. The Mesa Boogie design incorporated a large circuit that can be a drop in replacement for a conventional potentiometer in a guitar amplifier. The circuit is large and complicated. Two advantages of the Mesa Boogie circuit is that it can create resistances of up to 1 Meg Ohm or more, and can handle large signals, notably greater than +/−15V. The main disadvantage of this circuit is that it is very large and complicated, making it expensive to produce because it requires a large number of discrete components and a large board space. It is also impractical to build the circuit and enable a high degree of precision in controlling the resistance value of the wiper terminal because increasing the precision of the resistance control requires exponentially more discrete parts. It is often desirable to have many potentiometers to control the amplifier. Therefore, the Mesa Boogie approach can quickly become very complicated and expensive because it requires a large number of discrete parts to replace the conventional potentiometers.

Others have attempted to provide a guitar amplifier that has self-explanatory controls, is capable of producing the entire palette of traditional and modern amplifier guitar sounds both vacuum tube and digital sounds, and whose settings can be easily stored in a digital memory and recalled instantly via a controller. Such designs were unsuccessful because they isolated the digital potentiometers from the vacuum tube circuits with solid-state buffers and/or did not include any digital potentiometers that are directly driven by a vacuum tube. The potentiometers in a tube amp are typically on the order of 250K to 1M ohm. While prior designed preamps attempted to solve the continuing amplifier problem, there remains significant deficiencies that are not solved.

Mesa Boogie released its preamp in the early 1990s and no additional products are known that are similar to the Mesa Boogie preamp. Thus, the need for a vacuum tube amplifier with tone control circuits that accept digital potentiometers without the need for solid state buffers would result in a superior product: a vacuum tube guitar amplifier with a simple solution to digital control of the analog that does not compromise the "tube" sound of the amplifier.

The prior known, unsuccessful attempts paint a bleak picture of the likelihood of success. For example, within the background section of the Mesa Boogie patent, it says, "+15 and −15 volt supplies . . . cannot handle the high signal voltage produced at the output of a vacuum tube voltage amplifier." Also, the Mesa Boogie patent states that it is preferred to use resistors, "in the high resistance region required, namely 250 k ohms to 1 megohm." The digital potentiometers should operate from a +/−15 volt supply and have a maximum resistance of 100 k ohm. It would be greatly advantageous to design digital potentiometers throughout the preamplifier tone control circuits where conventional potentiometers would be commonly found without using any solid-state buffers to overcome the long-felt, but unsolved, problems. To design the tone control circuits to accept the digital potentiometers without any problems and without compromising the tone of the amplifier would be unexpected based upon what others have done before. Also, the digipots must be protected from high voltage signals because any signal overload will result in unwanted audio distortion. The tone control circuits must also be scaled to accept the lower resistance values while retaining the desired frequency response from the tone filters. Further, it would be advantageous to provide passive filters in the preamp. The digipots are always used in passive filters as in conventional tube amps.

The most significant prior art is the Mesa Boogie patent that was described above, U.S. Pat. No. 5,208,548, entitled “Programmable Controls for Vacuum Tube Preamplifier.” The Mesa Boogie patent describes, “A circuit for replacing an analog variable resistor in an audio amplifier” and “A circuit for replacing an analog variable attenuator in an audio amplifier.” A complete preamplifier is not addressed, but the rest of the patent describes how these circuits can be used as a drop in replacement for analog potentiometers in a vacuum tube amplifier. Thus, allowing digital control of an analog tube amp.

The Mesa Boogie design is able to preserve a “tube” tone, but the approach includes some very complicated and therefore expensive circuitry. Being a complex circuit, it is also susceptible to failure, and it also requires manually trimming the circuit that replaces the conventional potentiometers. The desired invention should use a single integrated circuit to replace each potentiometer, making such an invention a significant improvement over the Mesa Boogie approach as well as all other known approaches.

A second patent, U.S. Pat. No. 4,495,640, entitled “Adjustable Distortion Guitar Amplifier,” is another example of a programmable guitar amplifier that does not digitize the signal path. U.S. Pat. No. 4,495,640 describes another complicated effort that fails to achieve a workable solution. Programmable control of the resistance value is realized by using a discrete resistive ladder network and an analog multiplexer. As in the Mesa Boogie approach, it is impractical to have high precision in the resistance value because the circuit requires a large number of discrete components, and there is no issue of having to design for high signal voltages or low resistance values. The patent only mentions having one tube amplification stage, but any tube preamp for an electric guitar needs to have at least two tube gain stages in order to achieve the tube tone that guitar players desire. Typically, 3 or 4 tube stages are needed in vacuum tube preamps for electric guitars. Therefore, U.S. Pat. No. 4,495,640 does not represent a traditional vacuum tube guitar preamplifier.

Two additional patents, U.S. Pat. No. 5,866,834 and U.S. Pat. No. 6,075,194, assigned to Gibson Guitar are for tone shaping circuits that mount into a guitar and include digital potentiometers. The first patent, U.S. Pat. No. 5,866,834, mostly refers to electric guitars, and the second patent, U.S. Pat. No. 6,075,194, refers to use in acoustic guitars. Both of the Gibson Guitar circuits use digital potentiometers to digitally control the analog signal of the instrument. In the Gibson Guitar patents, tubes are not used in the design. Neither Gibson Guitar disclosure describes an electric guitar preamp. The design challenge of high voltage swings and high output impedances from tubes is not a factor in the Gibson Guitar designs. The Gibson Guitar designs are a pure solid-state design.

While some attempts have been made to implement digital control of a conventional vacuum tube guitar amplifier, all previous inventions either compromise the unique “pure tube” tone or implement digital control of the analog in a complicated and expensive manner. To achieve the desired result the amplifier should have all voltage gain achieved with vacuum tubes. This also means that all distortion should be introduced by vacuum tubes. Some other designs, like for example U.S. Pat. No. 4,495,640 have a number of solid-state gain stages which color the audio signal differently than vacuum tubes. Also, U.S. Pat. No. 4,495,640 mentions having only one tube stage that is driven by solid-state amplifiers. The ideal situation is to have a series of tube stages that directly drive each successive tube stage through a passive filter. Typically, 3 or 4 tube stages are found in a quality vacuum tube guitar preamplifier.

It is, therefore, a feature of the present invention is to a vacuum tube preamplifier, amplifier and method for musical instruments with programmable controls.

A feature of the present invention is to provide a vacuum tube preamplifier, amplifier and method for musical instruments with self-explanatory controls.

Another feature of the present invention is to provide a vacuum tube preamplifier, amplifier and method for musical instruments with capable of producing the entire palette of traditional and modern amplifier guitar sounds both vacuum tube and digital sounds.

Another feature of the present invention is to provide a vacuum tube preamplifier, amplifier and method for musical instruments with settings that can be easily stored in a digital memory and recalled instantly via an easily operated controller.

Another feature of the present invention is to provide a vacuum tube preamplifier, amplifier and method for musical instruments with tone control circuits that accept digital potentiometers without the need for solid state buffers.

Yet another feature of the invention is to provide a vacuum tube preamplifier, amplifier and method for musical instruments with a simple solution to digital control of the analog signals that does not compromise the “tube” sound of the amplifier.

Still another feature of the present invention is utilizing a vacuum tube preamplifier, amplifier and method for musical instruments with digital potentiometers that operate from about a +/−15 volt supply and have a maximum resistance of approximately 100 k ohm.

Another feature of the present invention is to provide a vacuum tube preamplifier, amplifier and method for musical instruments with tone control circuits in association with digital potentiometers that enhances the tone of the amplifier.

Yet another feature of the present invention is to provide a vacuum tube preamplifier, amplifier and method for musical instruments with tone control circuits that are scaled to accept lower resistance values while retaining the desired frequency response from the tone filters.

Still another feature of the present invention is to provide a vacuum tube preamplifier, amplifier and method for musical instruments with passive filters in the preamp.

Yet still another feature of the present invention is to provide a vacuum tube preamplifier, amplifier and method for musical instruments with all voltage gain achieved with vacuum tubes.

Yet further, an additional feature of the present invention is a vacuum tube preamplifier, amplifier and method for musical instruments with the distortion introduced by vacuum tubes.

Additional features and advantages of the invention will be set forth in part in the description which follows, and in part will become apparent from the description, or may be learned by practice of the invention. The features and advantages of the invention may be realized by means of the combinations and steps particularly pointed out in the appended claims.

SUMMARY OF THE INVENTION

To achieve the foregoing objects, features, and advantages and in accordance with the purpose of the invention as embodied and broadly described herein is an amplifier with self-explanatory controls, capable of producing the entire palette of traditional and modern amplifier guitar sounds with perfect authenticity, and whose settings can be easily stored in a digital memory and recalled instantly via an easily operated controller is provided. More particularly, the present invention provides a vacuum tube guitar preamplifier with digital control of an analog signal. The preamplifier is a pure vacuum tube amplifier. No solid-state buffers or amplifiers are used in the design. The digital potentiometers are connected to circuitry that is connected directly between the output and input of successive tube stages. Further, the present invention provides for the handling of a +/−15V signal range of the digital potentiometers and the low resistance, 100 k ohms, of the digital potentiometers. The present invention incorporates digital potentiometers into circuits that connect directly between the output and input of successive tube gain stages in order to have tone control circuits that are as similar as possible to conventional passive tone control circuits in a traditional vacuum tube amplifier.

BRIEF DESCRIPTION OF THE DRAWINGS

The accompanying drawings which are incorporated in and constitute a part of the specification, illustrate a preferred embodiment of the invention and together with the general description of the invention given above and the detailed description of the preferred embodiment given below, serve to explain the principles of the invention.

The above general description and the following detailed description are merely illustrative of the generic invention, and additional modes, advantages, and particulars of this invention will be readily suggested to those skilled in the art without departing from the spirit and scope of the invention.

DETAILED DESCRIPTION OF THE PREFERRED EMBODIMENTS

Reference will now be made in detail to the present preferred embodiments of the invention as described in the accompanying drawings.

Figure 1:
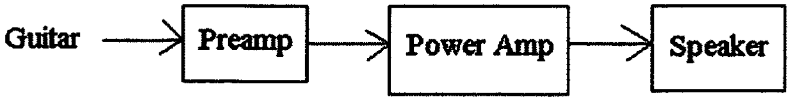
FIG. 1 is a flowchart illustrating a typical guitar amplifier.

FIG. 1 is a flowchart illustrating a typical guitar amplifier. The present invention is for the pre-amplification of an electric guitar, although it has versatility for use with any instrument. The invention is a guitar amp that uses digital circuitry to control the analog signal path through a vacuum tube amplifier. This results in a guitar amp featuring the flexibility and versatility of a digital system, and the sound quality of an all-analog vacuum tube amplifier. The output of an electric guitar is connected directly to the input of the preamp, and the output is most commonly connected to a power amplifier that drives a loudspeaker. In addition to amplifying the guitar output, the preamp also shapes the tone of the guitar signal. The tone can be varied by changing the settings of the preamplifier that typically include distortion, equalization, and volume. The distortion is arguably the most important aspect of the tone of a guitar amplifier. A system level diagram of a typical guitar amplifier can be seen below in FIG. 1.

Figure 2:
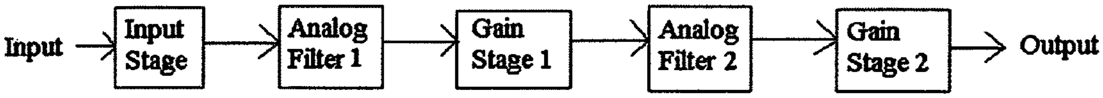
FIG. 2 is a flowchart illustrating a vacuum tube preamp signal path.

FIG. 2 is a flowchart illustrating a vacuum tube preamp signal path. The input stage is the first amplification stage. Analog filter 1 sets the level of the signal input to gain Stage 1. The transfer function of analog filter 1 is controlled by a digital potentiometer. Analog filter 2 and gain stage 2 work in a similar way. Both gain stage 1 and gain stage 2 can contribute significant amounts of distortion to the guitar signal, depending on the characteristics of the analog filters that are controlled by the digital potentiometers, which are in turn are controlled by the MCU. Thus, digital control over the distortion of the preamplifier is achieved.

Figure 3:
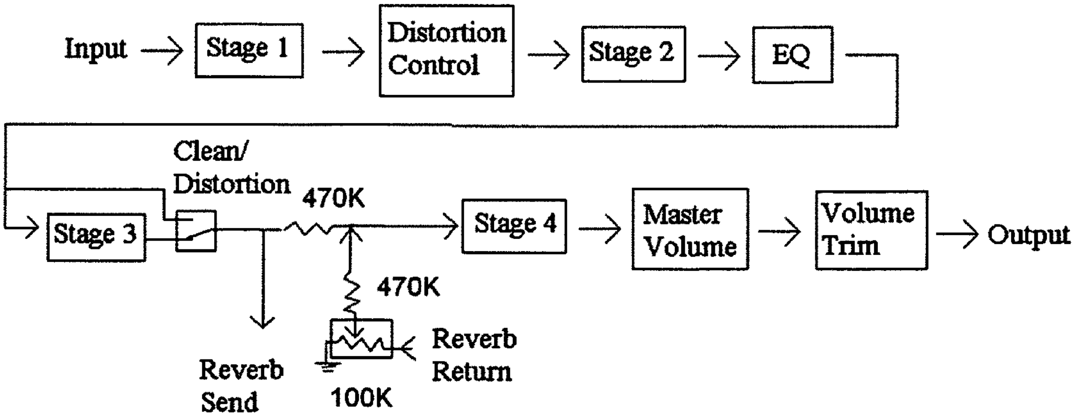
FIG. 3 is a flowchart illustrating an embodiment of the guitar amplifier as practiced by the present invention.

FIG. 3 is a flowchart illustrating an embodiment of the guitar amplifier as practiced by the present invention. The input is typically an electric guitar, and the output is usually connected to a power amplifier that drives a loudspeaker. Each stage is a vacuum tube gain stage. Between each stage of the preamplifier are passive RC filters that shape the tone of the input signal. Also included in FIG. 3 is a clean/distortion channel switching option and a send and return path for a reverb effect.

Figure 4:
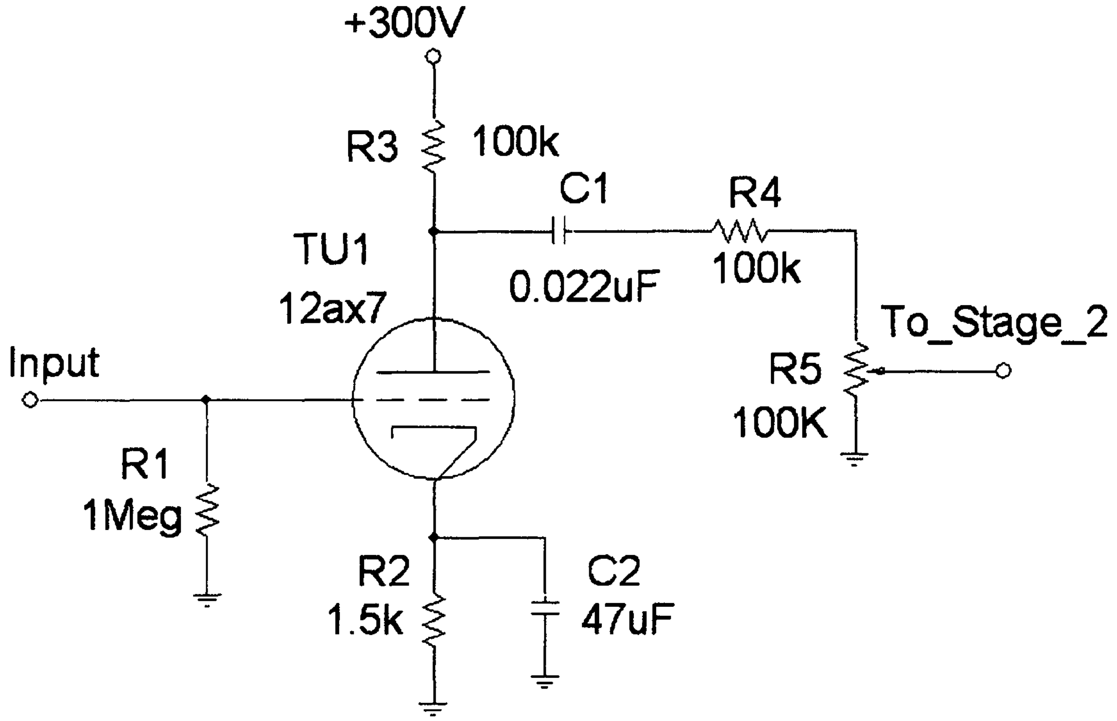
FIG. 4 is a diagram illustrating the Stage 1 and Distortion Control associated with an embodiment of the guitar amplifier as practiced by the present invention.

FIG. 4 is a diagram illustrating the Stage 1 and Distortion Control associated with an embodiment of the guitar amplifier as practiced by the present invention. The first gain stage is a typical tube input stage for a vacuum tube guitar preamp. The potentiometer at the output is a digital potentiometer, for example, Analog Devices part #AD7376. The digital potentiometer acts as a "gain" or "distortion" control for the preamp. The circuit in FIG. 4 connects directly to the second gain stage as seen in FIG. 5.

Figure 5:
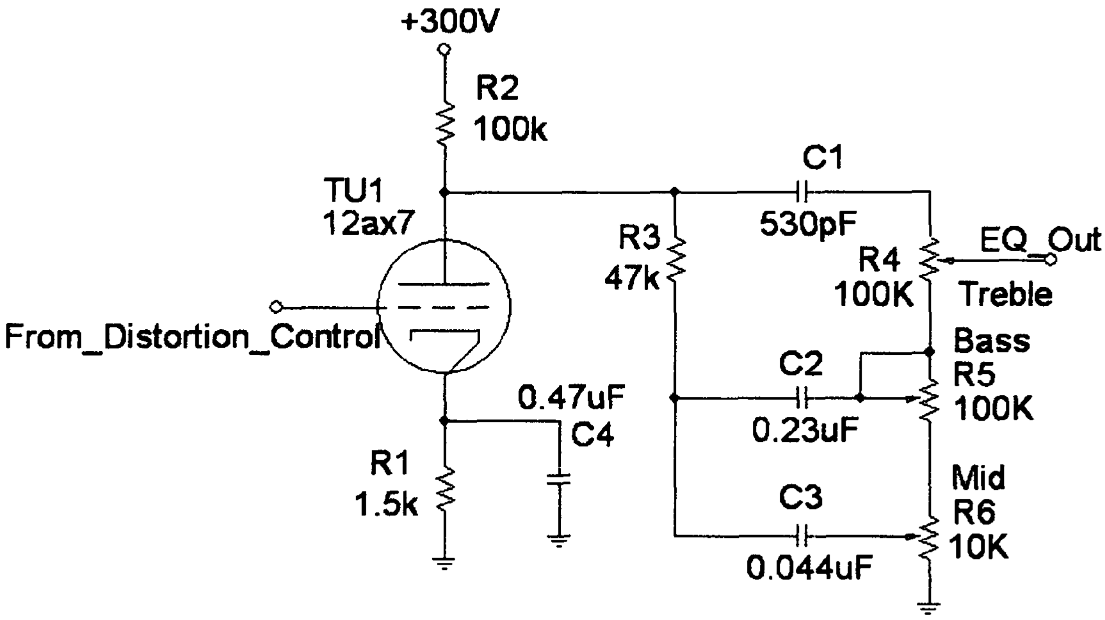
FIG. 5 is a diagram illustrating the Stage 2 and a passive 3-band audio filter for equalization control ("EQ") associated with an embodiment of the guitar amplifier as practiced by the present invention.

FIG. 5 is a diagram illustrating the Stage 2 and 3-band equalization controls ("EQ") associated with an embodiment of the guitar amplifier as practiced by the present invention. The second gain stage is another typical vacuum tube gain stage. The 3-band EQ is a traditional passive EQ network used in guitar amplifiers. This EQ design is also referenced in the Mesa Boogie patent, U.S. Pat. No. 5,208,548, in FIG. 1 of that patent. All of the potentiometers in FIG. 5 are digital potentiometers, part #AD7376. The treble and bass potentiometer values are typically around 250 k ohms or more, but such a large resistance is not currently available in an integrated digital potentiometer because it is difficult and expensive to fabricate large resistances on chip. Therefore, the values of the capacitors were scaled in order to use 100 k ohm potentiometers and have a similar frequency response as the traditional 3 band EQ with conventional potentiometers. The output of the EQ then connects to the third stage and to a SPDT switch input terminal.

Figure 6:
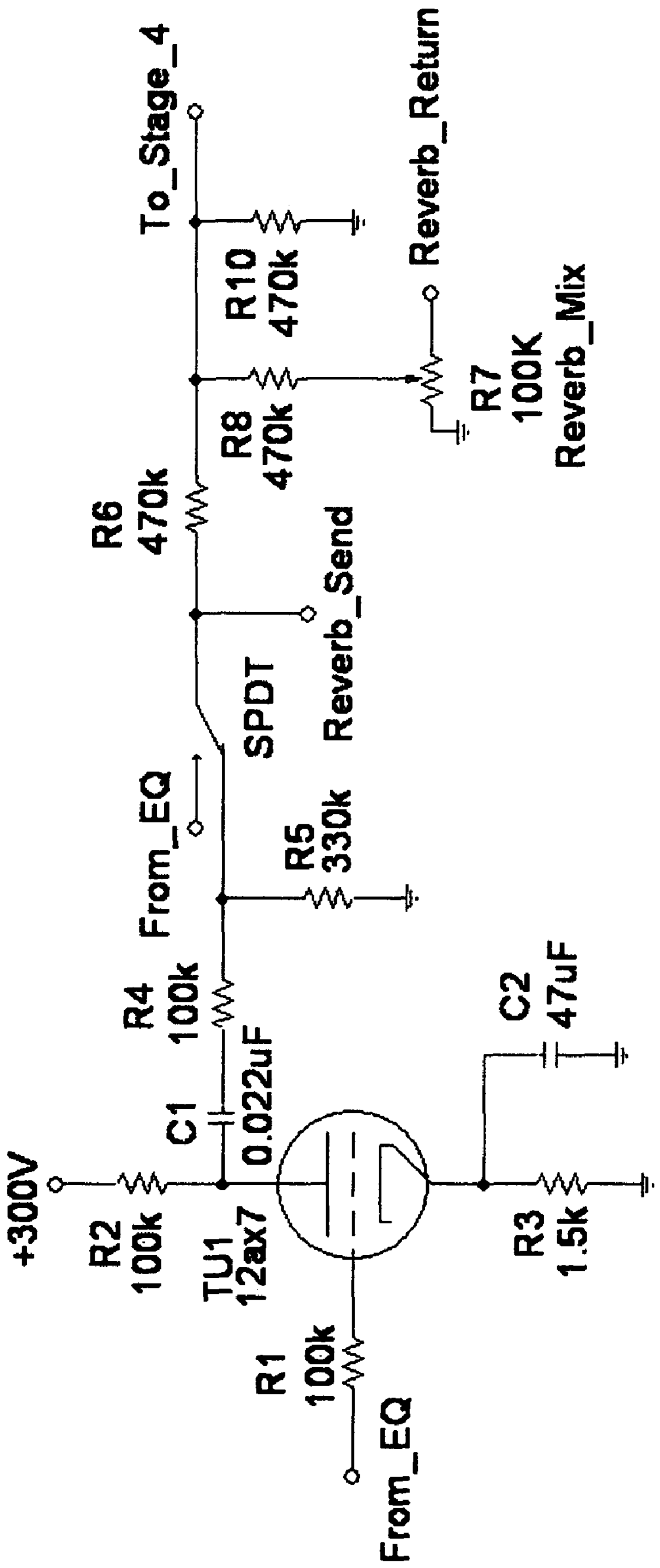
FIG. 6 is a diagram illustrating the Stage 3, channel switching and reverb mix associated with an embodiment of the guitar amplifier as practiced by the present invention.

FIG. 6 is a diagram illustrating the Stage 3 and Channel Switching associated with an embodiment of the guitar amplifier as practiced by the present invention. FIG. 6 is the schematic of the switching, third gain stage, and the reverb send and return path. The reverb potentiometer in FIG. 6 is a digital potentiometer that controls the amount of reverb mix to the guitar signal. Reverb is a common effect that is used in guitar amplifiers, but many other effects could be added in a similar manner. In this case, the reverb send path is used as the input to a spring reverb driver circuit, and the return path comes from the output of the spring reverb. The SPDT switch in FIG. 6 is used to route the guitar signal through or around the third stage of the preamp. When the third stage is bypassed, the amp has a "clean" sound. When the third stage is used, it overdrives the fourth stage, creating a "distortion" or "overdrive" sound. The output of the schematic in FIG. 6 connects to the input of the fourth gain stage in the preamp as seen in FIG. 7.

Figure 7:
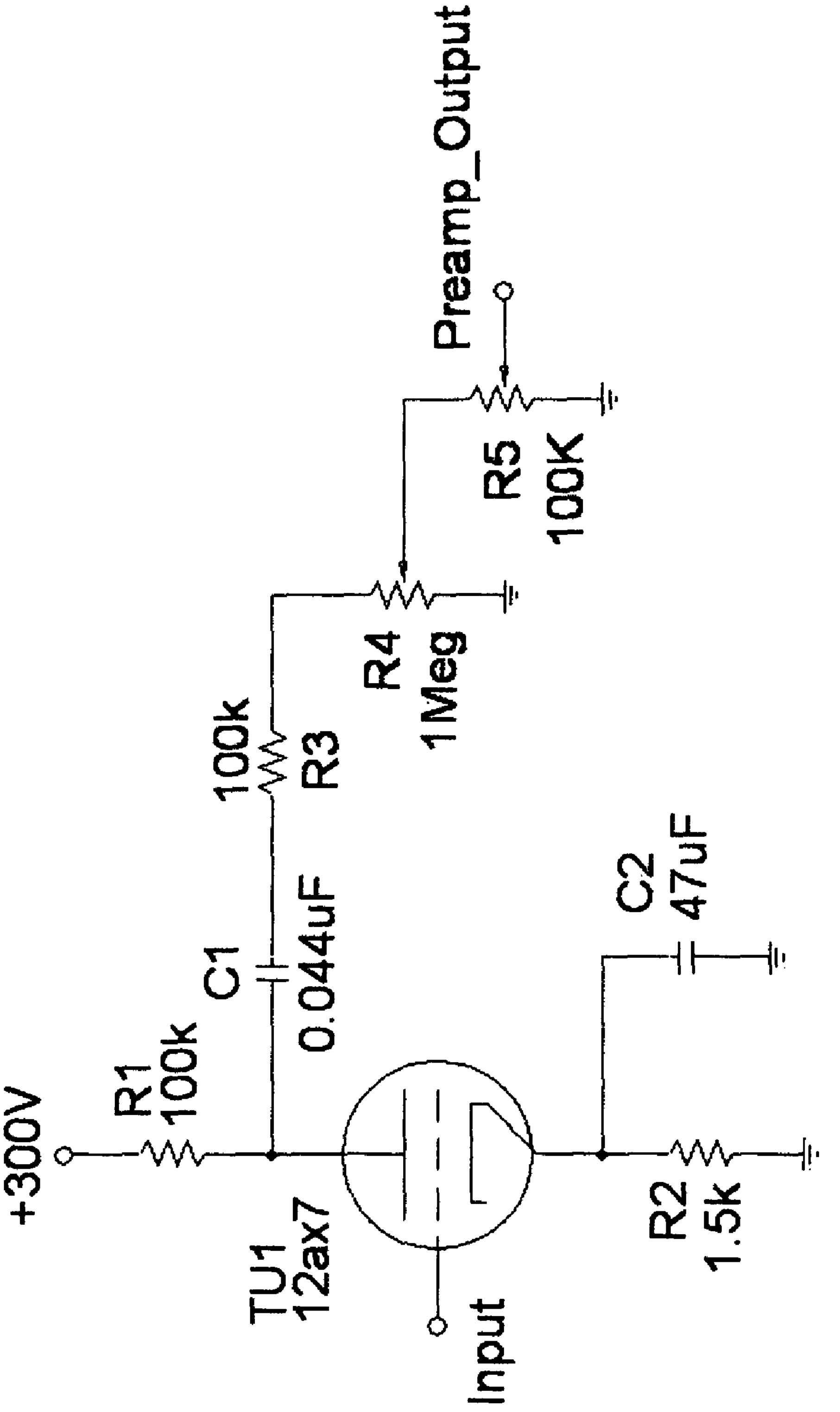
FIG. 7 is a diagram illustrating the Fourth Stage and volume controls associated with an embodiment of the guitar amplifier as practiced by the present invention.

FIG. 7 is a diagram illustrating the Fourth Stage and Volume Controls associated with an embodiment of the guitar amplifier as practiced by the present invention. The fourth gain stage is another typical vacuum tube gain stage. The 1 Meg ohm pot is a conventional potentiometer that controls the overall preamp volume, and the 100 k pot is a digital potentiometer that is a volume trim. The purpose of the volume trim is to adjust the relative volume of different settings of the amplifier. The preamp output is then typically connected to the input of a power amplifier. FIG. 1 shows how a guitar preamplifier is typically used in a complete electric guitar setup.

Figure 8:
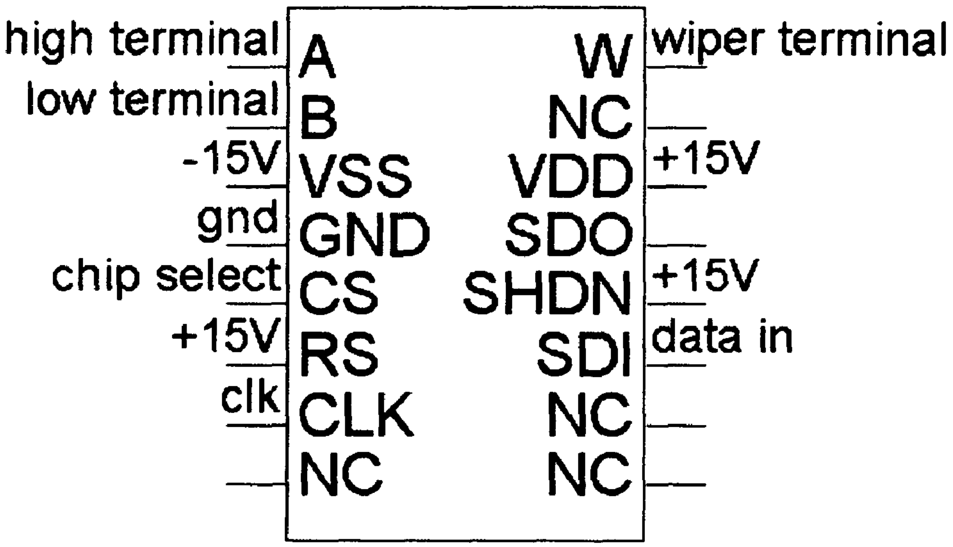
FIG. 8 is a diagram illustrating the digital potentiometer connections associated with an embodiment of the guitar amplifier as practiced by the present invention.

FIG. 8 is a diagram illustrating the digital potentiometer connections associated with an embodiment of the guitar amplifier as practiced by the present invention. Throughout the design, the digital potentiometers that are used are Analog Devices part #AD7376. The typical connections to this IC can be seen below in FIG. 8.

Figure 9:
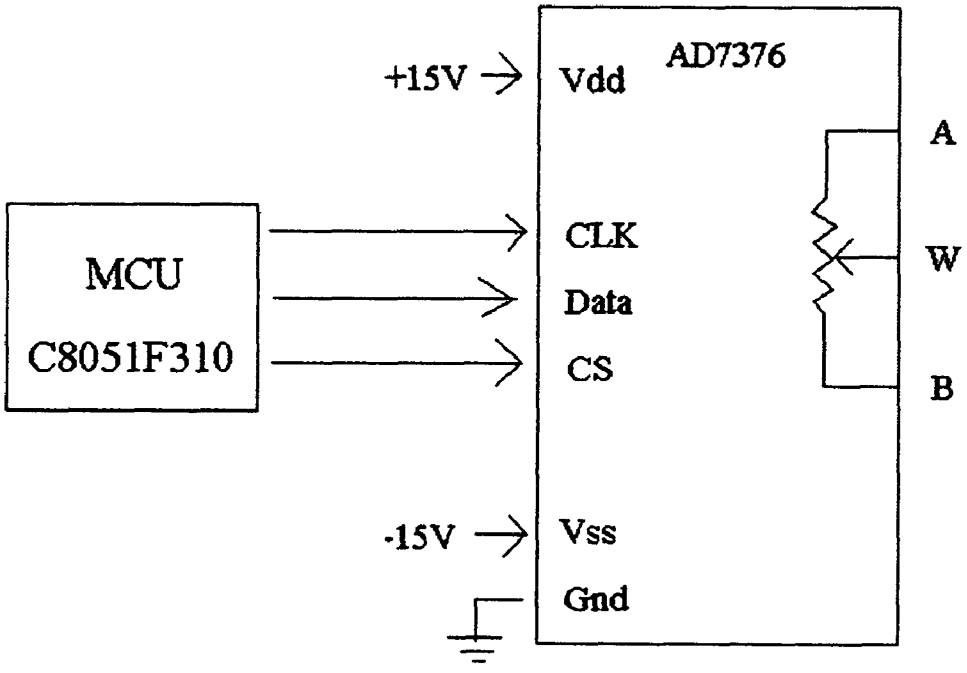
FIG. 9 is a diagram illustrating the microcontroller and digital interface associated with an embodiment of the guitar amplifier as practiced by the present invention.

FIG. 9 is a diagram illustrating the microcontroller and digital interface associated with an embodiment of the guitar amplifier as practiced by the present invention. The digital potentiometers interface with a Silicon Labs C8051F310 microcontroller as seen below in FIG. 9.

Figure 10:
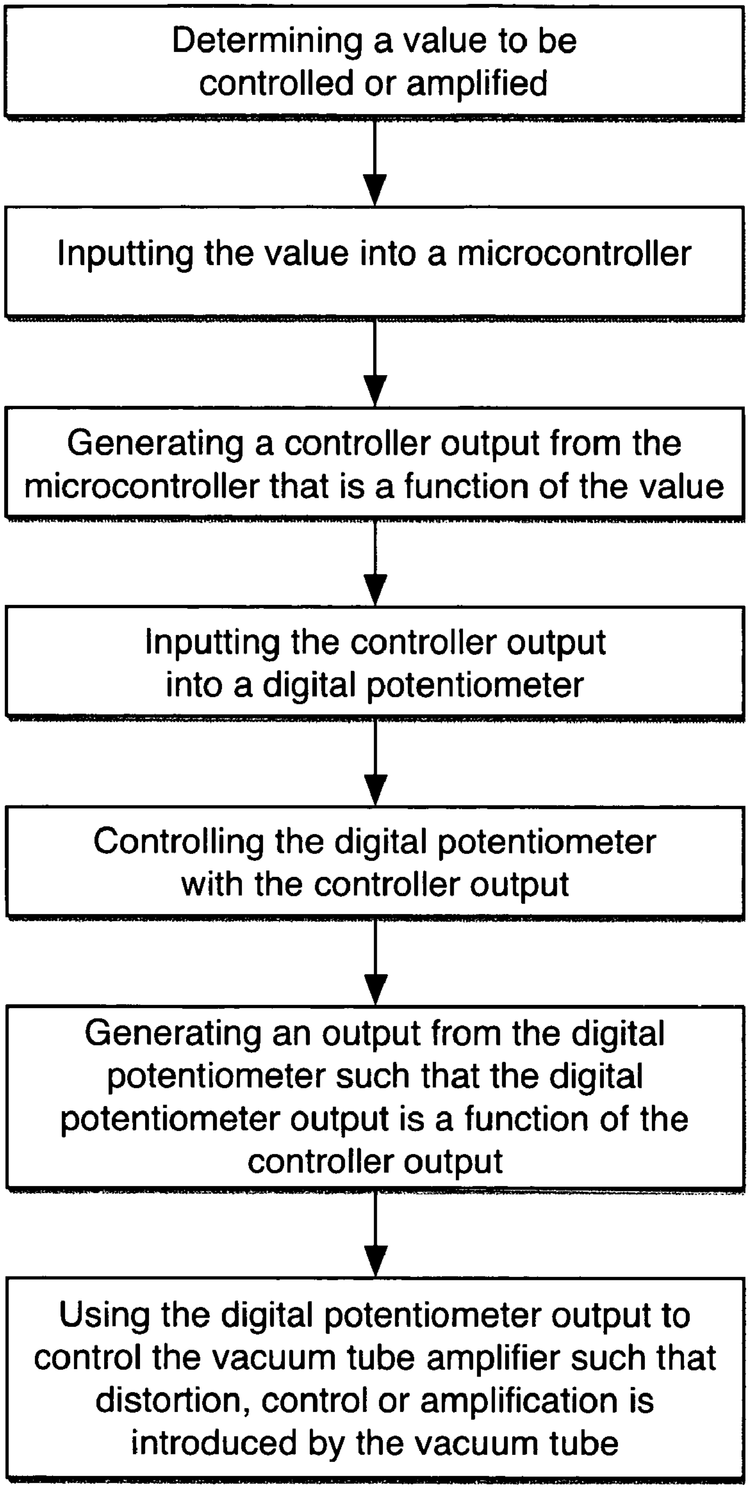
FIG. 10 is a flow chart illustrating the method of amplifying music using a vacuum tube amplifier as practiced by the present invention.

FIG. 10 is a flow chart illustrating a method of amplifying music using a vacuum tube amplifier as practiced by the present invention. The method of amplifying music from an instrument using a vacuum tube amplifier comprises the steps of determining a value of the music to be controlled or amplified, inputting the value into a microcontroller, generating a controller output from the microcontroller that is a function of the value, inputting the controller output into a digital potentiometer, controlling the digital potentiometer with the controller output, generating an output from the digital potentiometer such that the digital potentiometer output is a function of the controller output, using the digital potentiometer output to control the vacuum tube amplifier such that the control and/or amplification is introduced by the vacuum tube.

The value to be distorted, controlled or amplified is one or more of the distortion, the volume, the tone or the reverb mix. Further, the tone is one or more of the treble, the mid or the base.

Figure 11A:
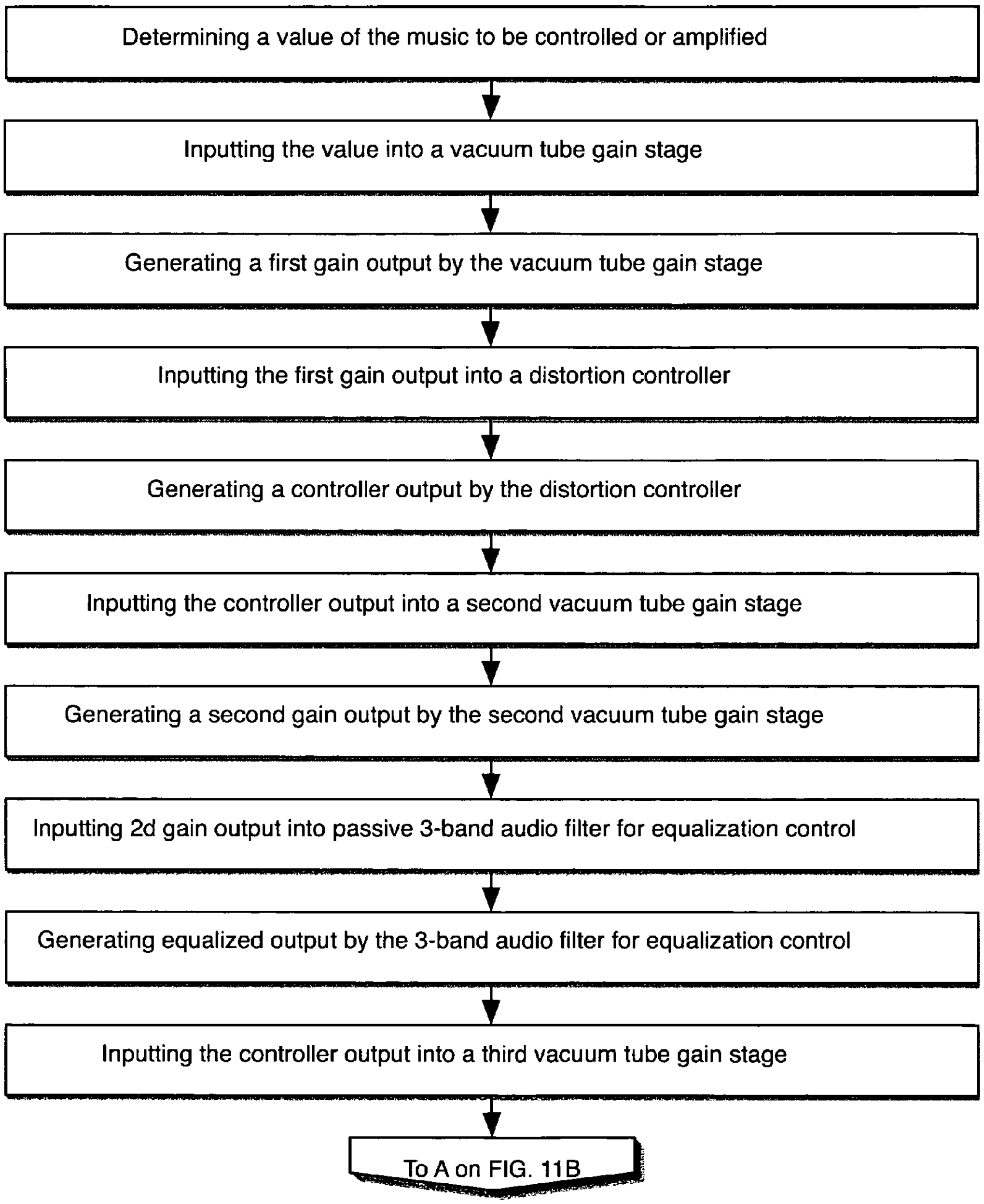
FIGS. 11A, 11B is a flow chart illustrating another method of amplifying music using a vacuum tube amplifier as practiced by the present invention.
Figure 11B:
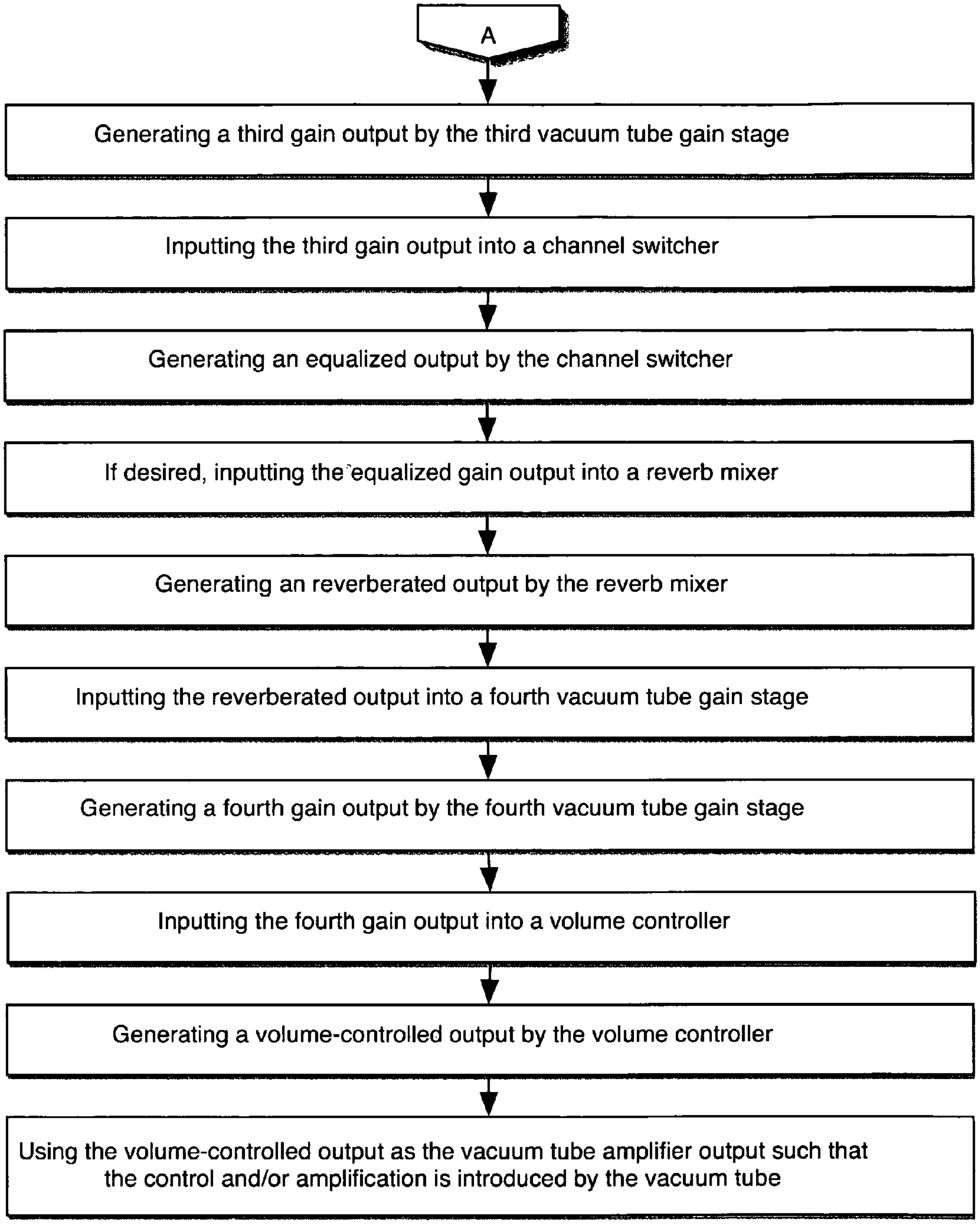

FIG. 11 is a flow chart illustrating another method of amplifying music using a vacuum tube amplifier as practiced by the present invention. The other method of amplifying music from an instrument using a vacuum tube amplifier comprises the steps of determining a value of the music to be controlled or amplified, inputting the value into a vacuum tube gain stage, generating a first gain output by the vacuum tube gain stage, inputting the first gain output into a distortion controller, generating a controller output by the distortion controller, inputting the controller output into a second vacuum tube gain stage, generating a second gain output by the second vacuum tube gain stage, inputting the second gain output into a passive 3-band audio filter for equalization control, generating a equalized output by the passive 3-band audio filter for equalization control, inputting the controller output into a third vacuum tube gain stage, generating a third gain output by the third vacuum tube gain stage, inputting the third gain output into a channel switcher, generating an equalized output by the channel switcher, if desired, inputting the equalized gain output into a reverb mixer, generating an reverberated output by the reverb mixer, inputting the reverberated output into a fourth vacuum tube gain stage, generating a fourth gain output by the fourth vacuum tube gain stage, inputting the fourth gain output into a volume controller, generating a volume-controlled output by the volume controller, and using the volume-controlled output as the vacuum tube amplifier output such that the control and/or amplification is introduced by the vacuum tube.

From the description and drawings defining the present invention, one can see that there are no solid-state amplifiers or buffers throughout the design, and the digital potentiometers ("digipots") are contained in circuitry between vacuum tube stages. The preamp has the standard controls that are typically found in a conventional tube amp, and digital potentiometers are used to control the various amp functions. The functions controlled by digital potentiometers are not limited to what is presented here. Other controls like presence, a filter for high treble frequencies, could also be easily implemented in a similar way in similar components such as for example in a power amplifier. The method used to control the specific preamp documented here can also be similarly implemented in any variations of a vacuum tube guitar preamp. Other channel switching options can also be designed into the preamp including but not limited to turning on or off cathode degeneration capacitors. While an important part of the invention is the absence of solid-state buffers in the design, solid-state buffers could be added to the present invention in certain places and not have any significant affect on the tone of the amplifier.

Additional advantages and modification will readily occur to those skilled in the art. The invention in its broader aspects is therefore not limited to the specific details, representative apparatus, and the illustrative examples shown and described herein. Accordingly, the departures may be made from the details without departing from the spirit or scope of the disclosed general inventive concept.

What is claimed is:

1. A method of amplifying music from an instrument using a vacuum tube amplifier comprises the steps of (a) determining a value of the music to be controlled or amplified, (b) inputting the value into a vacuum tube gain stage, (c) generating a first gain output by the vacuum tube gain stage, (d) inputting the first gain output into a distortion controller, (e)

generating a controller output by the distortion controller, (f) inputting the controller output into a second vacuum tube gain stage, (g) generating a second gain output by the second vacuum tube gain stage, (h) inputting the second gain output into a passive 3-band audio filter for equalization control, (i) generating an equalized output by the passive 3-band audio filter for equalization control, (j) inputting the controller output into a third vacuum tube gain stage, (k) generating a third gain output by the third vacuum tube gain stage, (l) inputting the third gain output into a channel switcher, (m) generating an equalized output by the channel switcher, (n) when desired, inputting the equalized output generated from the step (i) or the step (m) into a reverb mixer, (o) generating a reverberated output by the reverb mixer, (p) inputting the reverberated output into a fourth vacuum tube gain stage, (q) generating a fourth gain output by the fourth vacuum tube gain stage, (r) inputting the fourth gain output into a volume controller, (s) generating a volume-controlled output by the volume controller, and (t) using the volume-controlled output as the vacuum tube amplifier output such that the control, amplification, or combinations thereof is introduced by the vacuum tube amplifier.

2. The method of amplifying music from an instrument using a vacuum tube amplifier as defined in claim 1 wherein the value to be distorted, controlled, amplified, or combinations thereof is selected from the group consisting of distortion, volume, tone, reverb mix, or combinations thereof.

3. The method of amplifying music from an instrument using a vacuum tube amplifier as defined in claim 2 wherein the tone is selected from the group consisting of treble, mid, base, or combinations thereof.

* * * * *